(12) United States Patent
Pan et al.

(10) Patent No.: US 7,560,306 B2
(45) Date of Patent: Jul. 14, 2009

(54) MANUFACTURING PROCESS FOR CHIP PACKAGE WITHOUT CORE

(75) Inventors: Yu-Tang Pan, Tainan County (TW); Geng-Shin Shen, Tainan County (TW); Chun-Hung Lin, Tainan County (TW)

(73) Assignees: ChipMOS Technologies Inc., Hsinchu (TW); ChipMOS Technologies (Bermuda) Ltd., Hamilton (BM)

( * ) Notice: Subject to any disclaimer, the term of this patent is extended or adjusted under 35 U.S.C. 154(b) by 479 days.

(21) Appl. No.: 11/326,749

(22) Filed: Jan. 5, 2006

(65) Prior Publication Data

US 2007/0020816 A1    Jan. 25, 2007

(30) Foreign Application Priority Data

Jul. 21, 2005    (TW) .............................. 94124656 A

(51) Int. Cl.
*H01L 21/50* (2006.01)
*H01L 21/48* (2006.01)
(52) U.S. Cl. ...................... 438/109; 438/108; 438/617; 257/686; 257/E21.499
(58) Field of Classification Search ................. 438/109, 438/126, 108, 617; 257/686, E21.499
See application file for complete search history.

(56) References Cited

U.S. PATENT DOCUMENTS

| | | | | |
|---|---|---|---|---|
| 5,552,335 A * | 9/1996 | Mahon et al. ................. | 438/50 |
| 6,303,997 B1 * | 10/2001 | Lee ............................. | 257/778 |
| 6,507,098 B1 * | 1/2003 | Lo et al. ..................... | 257/686 |
| 6,528,722 B2 * | 3/2003 | Huang et al. ................ | 174/528 |
| 7,061,085 B2 * | 6/2006 | Moxham ..................... | 257/684 |
| 7,091,581 B1 * | 8/2006 | McLellan et al. ........... | 257/673 |
| 2002/0039808 A1 * | 4/2002 | Fukutomi et al. ........... | 438/106 |
| 2003/0205817 A1 * | 11/2003 | Romankiw ................... | 257/758 |
| 2004/0164400 A1 * | 8/2004 | Meyer-Berg ................ | 257/693 |
| 2006/0033185 A1 * | 2/2006 | Kummerl et al. ............ | 257/666 |
| 2006/0223234 A1 * | 10/2006 | Terayama et al. ........... | 438/113 |

* cited by examiner

*Primary Examiner*—Asok K Sarkar
(74) *Attorney, Agent, or Firm*—J. C. Patents

(57) ABSTRACT

A manufacturing process for chip package without core is disclosed. First of all, a conductive layer with a first surface and a second surface is provided. A first film is formed onto the first surface, and the conductive layer is patterned to form a patterned circuit layer. A solder resistance layer is formed on the patterned circuit layer and then patterned to expose parts of the patterned circuit layer. After a second film is formed on the solder resistance layer and the first film is removed, a chip is disposed on the first surface and electrically connected to the patterned circuit layer. A molding compound is formed to cover the patterned circuit layer and fix the chip onto the patterned circuit layer. After that, the second film is removed.

24 Claims, 5 Drawing Sheets

MANUFACTURING PROCESS FOR CHIP PACKAGE WITHOUT CORE

CROSS-REFERENCE TO RELATED APPLICATION

This application claims the priority benefit of Taiwan application serial no. 94124656, filed on Jul. 21, 2005. All disclosure of the Taiwan application is incorporated herein by reference.

BACKGROUND OF THE INVENTION

1. Field of Invention

The present invention relates to a manufacturing process for chip package. More particularly, the present invention relates to a manufacturing process for reducing the thickness of chip package.

2. Description of Related Art

In the current information society, users are pursuing electronic products with high speed, high quality and multi-function. As to the product appearance, the trend of the design of electronic products is light, thin, short and small. To achieve the above mentioned purposes, many manufacturers adopt the concept of systemization when designing circuits, with which a single chip can have many functions so as to reduce the number of chips used in an electronic product. Besides, as to the electronic package technology, in order to meet the design trend of being light, thin, short and small, various design concepts of chip package have been developed, e.g. multi-chip module (MCM), chip scale package (CSP) and stacked die package. A few of the traditional stacked die packages are illustrated respectively below.

FIG. 1 is a schematic section drawing of the traditional stacked die package. Referring to FIG. 1, the traditional stacked die package structure 50 includes a circuit substrate 100 and a number of chip packages 200*a* and 200*b* which are stacked on the circuit substrate 100 and electrically connected with the circuit substrate 100. Each of the chip packages 200*a* and 200*b* includes a package substrate 210, a chip 220, a number of bumps 230, an under fill 240 and a number of solder balls 250. The chip 220 and the bumps 230 are disposed on the package substrate 210 and the bumps 230 are disposed between the chip 220 and the package substrate 210 with which the chip 220 is electrically connected through these bumps. The under fill 240 is disposed between the chip 220 and the package substrate 210 to cover these bumps 230.

The package substrate 210 has a number of conducting poles 212 and a number of bonding pads 214; wherein, these conducting poles 212 run through the package substrate 210 respectively, and these bonding pads 214 are respectively disposed on these conducting poles 212. Besides, the solder balls 250 are disposed on these bonding pads 214. Thus, the chip package 200*a* and 200*b* are electrically connected with each other through the solder balls 250, and the chip package 200*b* is electrically connected to the circuit substrate 100 through the solder balls 250.

Generally, the fabrication of the package substrate 210 is that: using the core as core material, by means of the fully additive process, the semi-additive process, the subtractive process or other process, the patterned circuit layers and the patterned dielectric layers are interleavedly stacked on the core. Consequently, the core takes a relative great proportion of the whole thickness of the package substrate 210. Therefore, if the thickness of the core can not be effectively reduced, it will be very difficult to reduce the thickness of the chip packages 200*a* and 200*b*.

Naturally, if there is a bottleneck in reducing the thickness of the chip packages 200*a* and 200*b*, it will be hard for the whole thickness of the stacked die package 50 to be remarkably reduced. Furthermore, it will be impossible to effectively increase the package integration of the stacked die package 50.

SUMMARY OF THE INVENTION

Accordingly, the present invention is directed to provide a manufacturing process for chip package in order to reduce the thickness of chip package.

The present invention provides a manufacturing process for chip package, which includes the following steps. First, a conductive layer with a first surface and a second surface is provided. Second, a solder resistance layer is formed onto the first surface and then patterned to expose parts of the conductive layer. Next, a film is formed on the solder resistance layer and the conductive layer is patterned to form a patterned circuit layer. Then, a chip is disposed on the second surface and electrically connected to the patterned circuit layer. After that, a molding compound is formed to cover the patterned circuit layer and fix the chip onto the patterned circuit layer. Last, the film is removed.

According to the manufacturing process for chip package of a preferred embodiment of the present invention, the film is stuck to the solder resistance layer by means of, for example, a first adhesive compound.

The manufacturing process for chip package according to the preferred embodiment of the present invention further includes, for example, fixing the film onto a frame in order to perform the step of patterning the conductive layer.

The manufacturing process for chip package according to the preferred embodiment of the present invention further includes the steps, for example: first, patterning the solder resistance layer to form a number of first openings on the solder resistance layer; a number of second openings corresponding to the first openings are formed on the film. These first openings and second openings are used to expose parts of the conductive layer or the patterned circuit layer.

The manufacturing process for chip package according to the preferred embodiment of the present invention further includes, for example, forming an outer connection terminal in each of the first openings so that the outer connection terminals are electrically connected to the patterned circuit layer through the first openings.

The manufacturing process for chip package according to the preferred embodiment of the present invention further includes the steps, for example: first, a number of third openings are formed on the solder resistance layer by patterning the solder resistance layer; a number of fourth openings corresponding to the third openings are formed on the film. Wherein, these third openings and fourth openings are used to expose parts of the chip and parts of the patterned circuit layer.

The manufacturing process for chip package according to the preferred embodiment of the present invention further includes that, for example: first, a second adhesive compound is formed between the chip and the patterned circuit layer so as to fix the chip onto the patterned circuit layer; then, the chip is electrically connected to the patterned circuit layer by means of a number of conducting wires.

The manufacturing process for chip package according to the preferred embodiment of the present invention further includes, for example, forming a number of through holes on the molding compound so as to expose parts of the patterned circuit layer.

The manufacturing process for chip package according to the preferred embodiment of the present invention further includes, for example, forming an outer connection terminal in each of the through holes and then electrically connecting these outer connection terminals to the patterned circuit layer through the through holes.

The manufacturing process for chip package according to the preferred embodiment of the present invention further includes, for example, forming a number of bumps between the chip and the patterned circuit layer.

The manufacturing process for chip package according to the preferred embodiment of the present invention further includes, for example, forming an under fill between the chip and the patterned circuit layer in order to cover the bumps.

According to the manufacturing process for chip package of the preferred embodiment of the present invention, the method of removing the film includes, for example, etching, tearing or ashing.

The present invention provides another manufacturing process for chip package, which includes the following steps. First of all, a conductive layer with a first surface and a second surface is provided. Second, a first film is formed onto the first surface, and the conductive layer is patterned to form a patterned circuit layer. Next, a solder resistance layer is formed on the patterned circuit layer and then patterned to expose parts of the patterned circuit layer. Then, a second film is formed on the solder resistance layer and the first film is removed. Then, a chip is disposed on the first surface and electrically connected to the patterned circuit layer. Afterwards, a molding compound is formed to cover the patterned circuit layer and fix the chip onto the patterned circuit layer. Finally, the second film is removed.

According to the manufacturing process for chip package of another preferred embodiment of the present invention, wherein, the first film and the second film are stuck respectively to the first surface and the solder resistance layer by means of, for example, a first adhesive compound.

The manufacturing process for chip package according to another preferred embodiment of the present invention further includes, for example, fixing the second film onto the frame.

The manufacturing process for chip package according to another preferred embodiment of the present invention further includes that, for example: first, patterning the solder resistance layer to form a number of first openings on the solder resistance layer; a number of second openings corresponding to the first openings are formed on the second film. These first openings and second openings are used to expose parts of the patterned conductive layer.

The manufacturing process for chip package according to another preferred embodiment of the present invention further includes forming an outer connection terminal in each of the first openings so as to electrically connect these outer connection terminals to the patterned circuit layer through the first openings.

The manufacturing process for chip package according to another preferred embodiment of the present invention further includes, for example, forming a number of through holes in the molding compound so as to expose parts of the patterned circuit layer.

The manufacturing process for chip package according to another preferred embodiment of the present invention further includes, for example, forming an outer connection terminal in each of the through holes so as to electrically connect these outer connection terminals to the patterned circuit layer through the through holes.

The manufacturing process for chip package according to another preferred embodiment of the present invention further includes, for example, forming a number of bumps between the chip and the patterned circuit layer.

The manufacturing process for chip package according to another preferred embodiment of the present invention further includes, for example, forming an under fill between the chip and the patterned circuit layer so as to cover the bumps.

The manufacturing process for chip package according to another preferred embodiment of the present invention further includes that, for example: first, a number of third openings are formed on the solder resistance layer by patterning the solder resistance layer; a number of fourth openings corresponding to the third openings are formed on the second film. These third openings and fourth openings are used to expose parts of the chip and parts of the patterned circuit layer.

The manufacturing process for chip package according to another preferred embodiment of the present invention further includes that, for example: first, a second adhesive compound is formed between the chip and the patterned circuit layer so as to fix the chip onto the patterned circuit layer; then, the chip is electrically connected to the patterned circuit layer by means of a number of conducting wires.

According to the manufacturing process for chip package of another preferred embodiment of the present invention, the method of removing the films includes, for example, etching, tearing or ashing.

During the manufacturing process for chip package, the present invention uses film as the support of the patterned circuit layer and the solder resistance layer, and the film can be removed after the chip package is finished, so that the present invention produces the chip package without using core. Without core, the chip package produced by the present invention has a smaller thickness than that produced by the traditional technology.

In order to make the aforementioned and other objects, features and advantages of the present invention comprehensible, preferred embodiments accompanied with figures is described in detail below.

DESCRIPTION OF EMBODIMENTS

The First Preferred Embodiment

Figure 1:
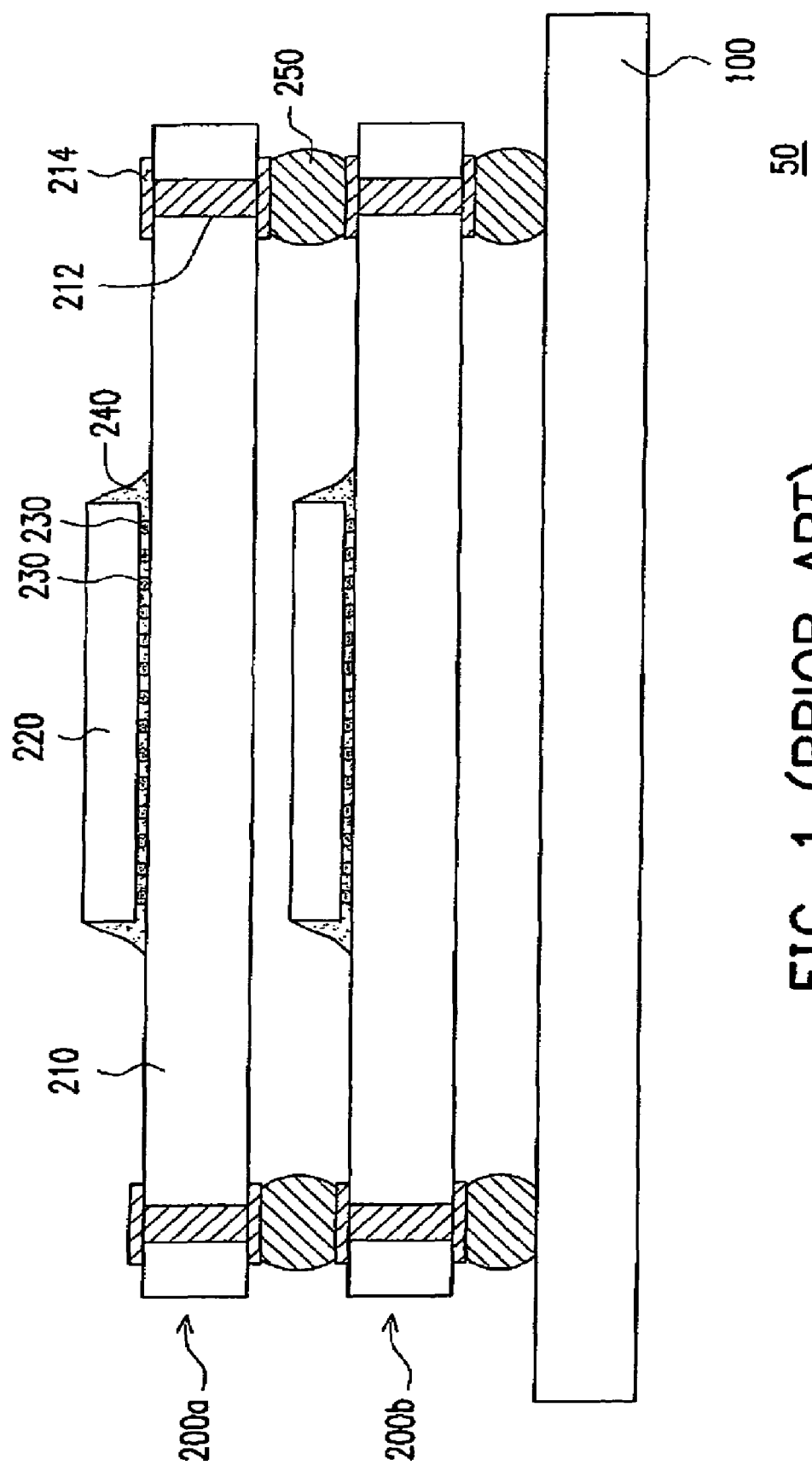
FIG. 1 is a schematic section drawing of the traditional stacked die package.
Figure 2A:
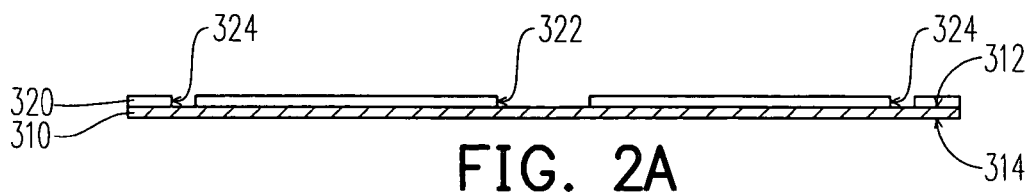
FIG. 2A to FIG. 2F is the flow chart of the manufacturing process for chip package of the first preferred embodiment of the present invention.

FIG. 2A to FIG. 2F is the flow chart of the manufacturing process for chip package of the first preferred embodiment of the present invention. Referring to FIG. 2A, first of all, the conductive layer 310 with the opposite first surface 312 and second surface 314 is provided; and its material of the conductive layer 310 is copper. Then, the solder resistance layer 320 is formed onto the first surface 312. The solder resistance layer 320 is patterned by means of, for example, lithography and etching process, so that a third opening 322 and a number of the first openings 324 are formed; the third opening 322 and a number of the first openings 324 are used to expose parts of the conductive layer 310. In a preferred embodiment, the conductive layer 310 can further be processed with brown oxidation or black oxidation to increase its roughness and improve the connection between the conductive layer 310 and the solder resistance layer 320.

Figure 2B:
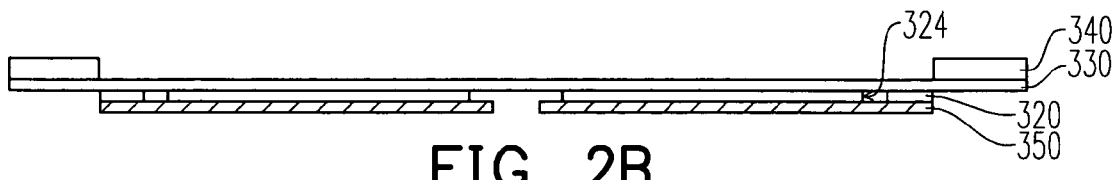

Next, referring to FIG. 2B, a film 330 is formed on the solder resistance layer 320 and used as the support of the successive manufacturing processes for the conductive layer 310 and the solder resistance layer 320. Wherein, the film 330 is stuck onto the solder resistance layer 320 by means of, for example, the adhesive compound, or directly formed onto the solder resistance layer 320 by other way. Therefore, the conductive layer 310 and the solder resistance layer 320 can have enough support for the successive manufacturing processes so as to facilitate the successive manufacturing processes smoothly. In a preferred embodiment, the film 330 can further be fixed onto a frame 340, so that the conductive layer 310 and the solder resistance layer 320 can have better support. Afterwards, the conductive layer 310 is patterned to form the patterned circuit layer 350 by, for example, lithograph and etching process.

Figure 2C:
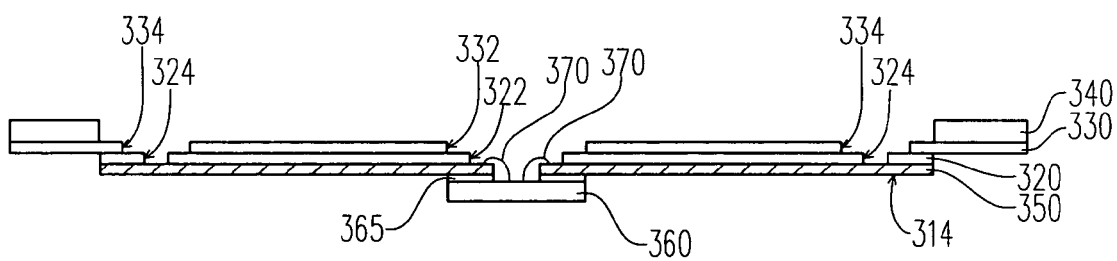

Then, referring to FIG. 2C, the fourth opening 332 and a number of second openings 334 are formed on the film 330 by means of, for example, lithograph process and etching process. Afterwards, the chip 360 is disposed onto the second surface 314 by way of, for example, disposing the adhesive compound 365 between the chip 360 and the patterned circuit layer 350 to fix their relative location. Next, by means of the wire bonding technology, the chip 360 is electrically connected to the patterned circuit layer 350 through a number of conducting wires 370. Wherein, the material of the conducting wires 370 is, for example, gold. The first opening 324 and the second openings 334 are used to expose parts of the patterned circuit layer 350; the third opening 322 and the fourth openings 332 are used to expose both of parts of the patterned circuit layer 350 and parts of the chip 360.

Of course, in the embodiment, forming the fourth opening 332 and the second opening 334 can be performed either after patterning the conductive layer 310 or before patterning the conductive layer 310. Thereafter, the conductive layer 310 is patterned so as to form the patterned circuit layer 350.

Figure 2D:
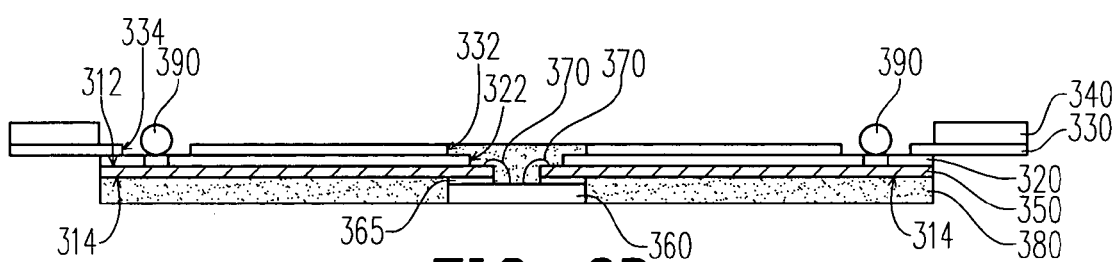

Referring to FIG. 2D, by means of a proper mold, the molding compound 380 is formed on the patterned circuit layer 350 to cover the patterned circuit layer 350 and the chip 360 and fix the chip 360 onto the patterned circuit layer 350. Besides, in the embodiment, by means of a proper mold, the molding compound 380 can further be filled into the second opening 322 to cover the conducting wires 370. Furthermore, in the embodiment, the outer connection terminals 390 can further be formed in each of the first openings 324 and then electrically connected to the patterned circuit layer 350 through the first openings 324. For example, if the outer connection terminals 390 are the solder balls, they can be electrically connected to the patterned circuit layer 350 through reflowing.

Figure 2E:
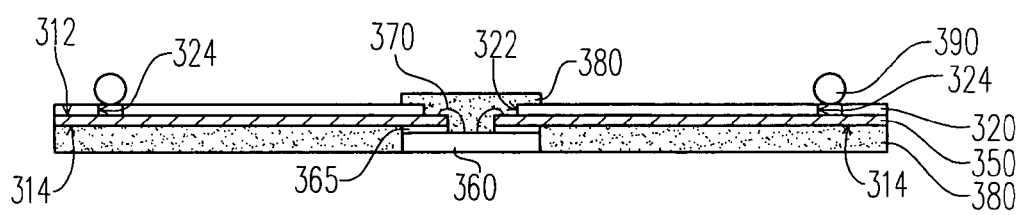
Figure 2F:
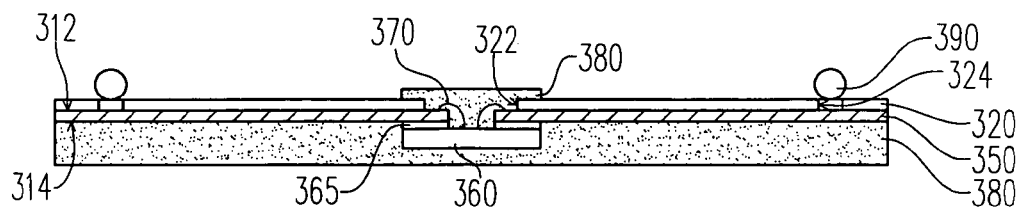

Afterwards, referring to FIG. 2E, the film 330 is removed to obtain the chip package 300. Wherein, the method of removing the film 330 can be, for example, etching or ashing or directly tearing the film, or other modes. Although in the embodiment the molding compound 380 is used to expose parts of the chip 360, obviously, in the embodiment the molding compound 380 can also be made to cover the chip 360 as shown in FIG. 2F by means of a proper mold.

Therefore, the chip package 300 produced by the present embodiment mainly includes the patterned circuit layer 350, the chip 360, the solder resistance layer 320 and the molding compound 380. Wherein, the patterned circuit layer 350 has the opposite first surface 312 and second surface 314. The chip 360 is disposed in the second surface 314, and the chip 360 is electrically connected to the patterned circuit layer 350. The solder resistance layer 320 is disposed on the first surface 312 and has a number of first openings 324 to expose parts of the patterned circuit layer 350. The molding compound 380 covers the patterned circuit layer 350 and fixes the chip 360 onto the patterned circuit layer 350.

The present embodiment uses the film 330 to produce the chip package 300 without core, so that the chip package 300 has a smaller thickness than the one produced by the traditional technology.

The Second Embodiment

In the manufacturing process for chip package, in addition to what is disclosed in the first embodiment in which the chip 360 is electrically connected to the patterned circuit layer 350 by the wire bonding technology, the chip 360 can also be electrically connected to the patterned circuit layer 350 by the flip chip technology, the chip on flex (COF) technology and other technologies. The manufacturing processes for chip package are illustrated below with the example of the flip chip technology.

Figure 3A:
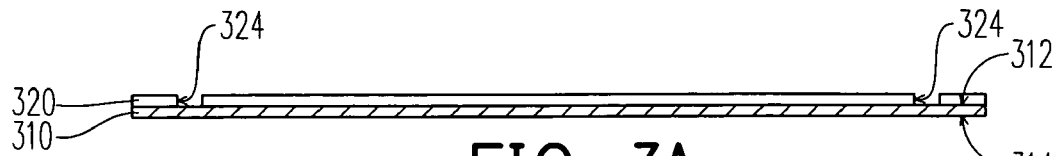
FIG. 3A to FIG. 3F is the flow chart of the manufacturing process for chip package of the second preferred embodiment of the present invention.

FIG. 3A to FIG. 3F is the flow chart of the manufacturing process for chip package of the second embodiment of the present invention. Referring to FIG. 3A, first of all, the conductive layer 310 with the opposite first surface 312 and second surface 314 is provided. Then, the solder resistance layer 320 is formed onto the first surface 312. The solder resistance layer 320 is patterned by means of, for example, lithography and etching process, so that a number of the first openings 324 is formed to expose parts of the conductive layer 310. Similarly, in the present embodiment, the conductive layer 310 can be processed with brown oxidation or the black oxidation to increase its roughness and improve the connectivity between the conductive layer 310 and the solder resistance layer 320.

Figure 3B:
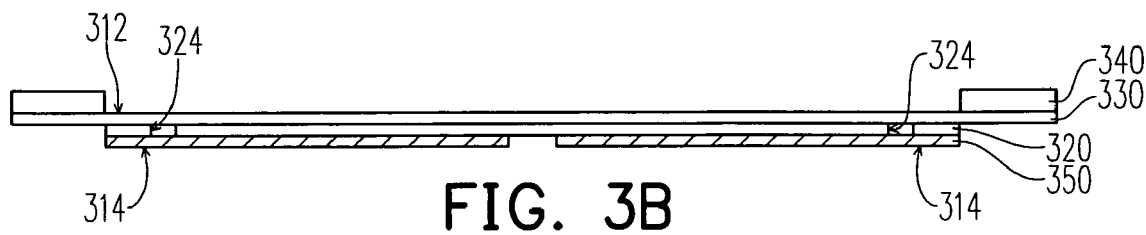

Next, referring to FIG. 3B, a film 330 is formed on the solder resistance layer 320 and used as the support of the successive manufacturing processes for the conductive layer 310 and the solder resistance layer 320. Wherein, the film 330 is stuck onto the solder resistance layer 320 by means of, for example, the adhesive compound, or directly formed onto the solder resistance layer 320 by other way. Likewise, in the present embodiment, the film 330 can further be fixed onto the frame 340, so that the conductive layer 310 and the solder resistance layer 320 can have better support. Afterwards, the conductive layer 310 is patterned to form the patterned circuit layer 350 by, for example, lithograph and etching process.

Figure 3C:
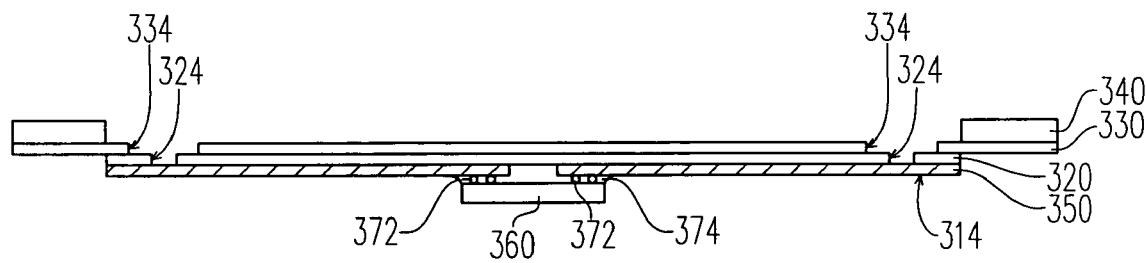

Then, referring to FIG. 3C, a number of second openings 334 are formed on the film 330 by means of, for example, lithograph and etching process. Afterwards, the chip 360 is disposed onto the second surface 314 by the flip chip technology, with which, for example, a number of bumps 372 are disposed between the chip 360 and the patterned circuit layer 350, and then the bumps are reflowed, so that the chip 360 is electrically connected to the patterned circuit layer 350 through these bumps 372. Wherein, the material of the bumps 372 is, for example, soldering tin, gold or other conducting material. The first opening 324 and the second opening 334 are used to expose parts of the patterned circuit layer 350. Besides, the present embodiment may further form the under fill 374 between the chip 360 and the patterned circuit layer 350 to cover these bumps 372.

Figure 3D:
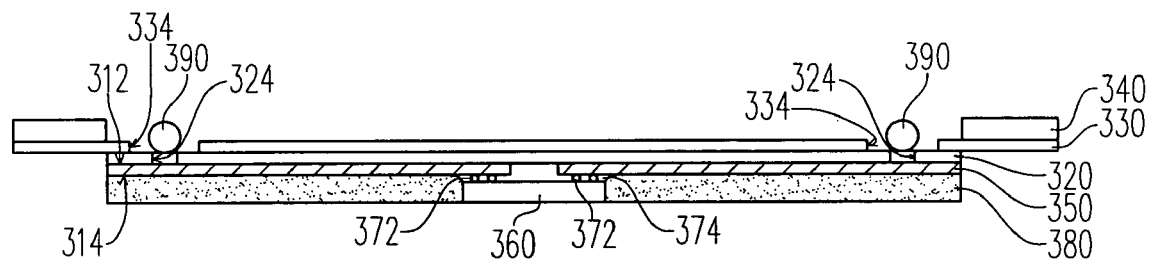

Referring to FIG. 3D, by means of a proper mold, on the patterned circuit layer 350, the molding compound 380 is formed to cover the patterned circuit layer 350 and to fix the chip 360 onto the patterned circuit layer 350. It is noticeable that in the step shown in FIG. 3C, if an under fill 374 is not formed between the chip 360 and the patterned circuit layer 350, the molding compound 380 can be used to substitute the under fill 374 to cover these bumps 372. Besides, in the embodiment, the outer connection terminals 390 can further be formed on each of the first openings 324 and then electrically connected to the patterned circuit layer 350 through the first openings 324. For example, if the outer connection terminals 390 are the solder balls, they can be electrically connected to the patterned circuit layer 350 through reflowing.

Figure 3E:
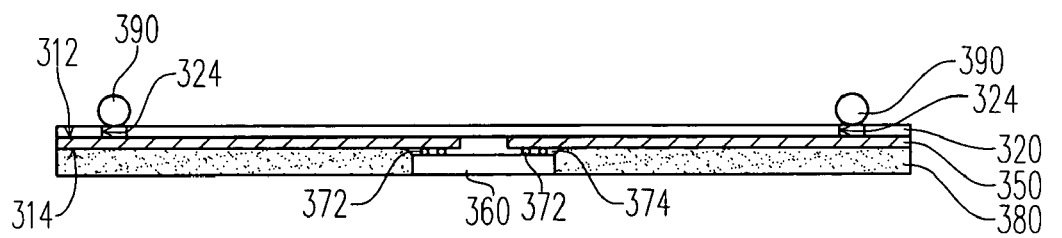
Figure 3F:
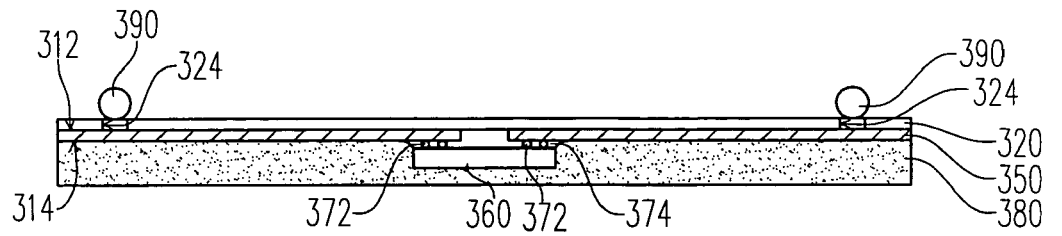

Lastly, referring to FIG. 3E, the film 330 is removed so as to obtain the chip package 300'. Wherein, the method of removing the film 330 can be referred to the illustration of FIG. 2E; here, the detail is not repeated again. Although in the embodiment the molding compound 380 is used to expose parts of the chip 360, obviously, in the embodiment the molding compound 380 can also be made to cover the chip 360 as shown in FIG. 3F by means of a proper mold.

The Third Embodiment

Besides the chip packages 300 and 300', the manufacturing process for chip package disclosed in the present invention can further manufacture another kind of chip package for stacked die package whose manufacturing process is illustrated in detail below.

Figure 4A:
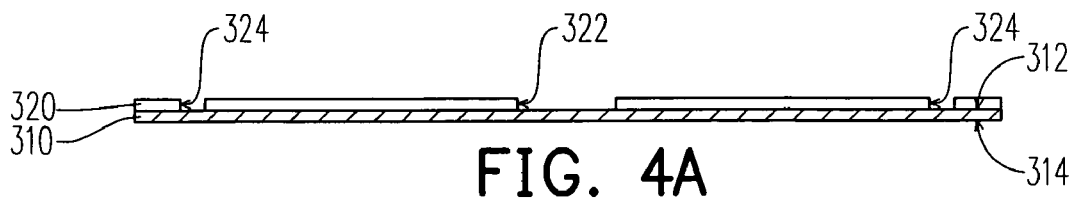
FIG. 4A to FIG. 4E is the flow chart of the manufacturing process for chip package of the third preferred embodiment of the present invention.

FIG. 4A to FIG. 4F is the flow chart of the manufacturing process for chip package of the third preferred embodiment of the present invention. Referring to FIG. 4A, first of all, the conductive layer 310 with the opposite first surface 312 and second surface 314 is provided. Next, the solder resistance layer 320 is formed onto the first surface 312 and then patterned by means of, for example, lithography and etching processr, so that the third opening 322 and a number of the first openings 324 are formed which are used to expose parts of the conductive layer 310. In a preferred embodiment of the present invention, the conductive layer 310 can further be processed with brown oxidation or black oxidation to increase the roughness of the conductive layer 310 and improve the connectivity between the conductive layer 310 and the solder resistance layer 320.

Figure 4B:

Next, referring to FIG. 4B, a film 330 is formed on the solder resistance layer 320 and used as the support of the successive manufacturing processes for the conductive layer 310 and the solder resistance layer 320. Wherein, the film 330 is stuck onto the solder resistance layer 320 by means of, for example, the adhesive compound, or directly formed onto the solder resistance layer 320 by other way. Thus, the conductive layer 310 and the solder resistance layer 320 can have enough support for the successive manufacturing processes so as to perform the successive manufacturing processes smoothly. In a preferred embodiment of the present invention, the film 330 can further be fixed onto the frame 340, so that the conductive layer 310 and the solder resistance layer 320 can have better support. Afterwards, the conductive layer 310 is patterned to form the patterned circuit layer 350 by, for example, lithograph and etching process.

Figure 4C:
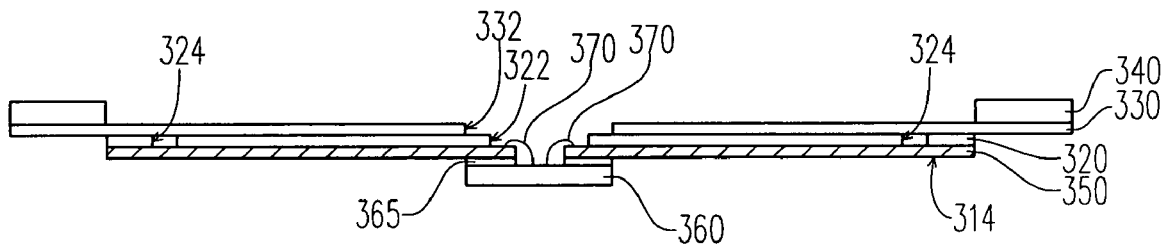

Then, referring to FIG. 4C, the chip 360 is disposed onto the second surface 314 by, for example, disposing the adhesive compound 365 between the chip 360 and the patterned circuit layer 350. Next, the chip 360 is electrically connected to the patterned circuit layer 350 through a number of conducting wires 370 by, for example, wire bonding technology. Wherein, the third opening 322 and the fourth openings 332 are used to expose both of parts of the patterned circuit layer 350 and parts of the chip 360.

Of course, in the embodiment the step of forming the third opening 332 can be performed either after or before patterning the conductive layer 310. Thereafter, the conductive layer 310 is patterned so as to form the patterned circuit layer 350.

Figure 4D:
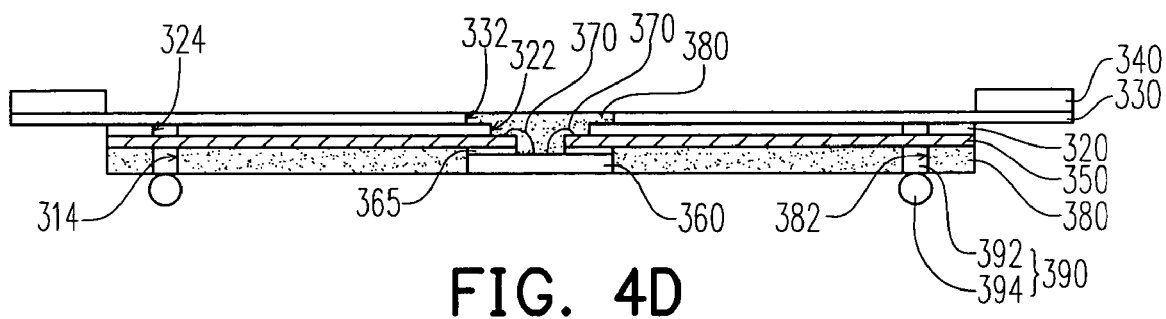

Referring to FIG. 4D, by means of a proper mold, the molding compound 380 is formed on the patterned circuit layer 350 to cover the patterned circuit layer 350 and the chip 360 and fix the chip 360 onto the patterned circuit layer 350. Besides, in the embodiment, by means of a proper mold, the molding compound 380 can further be filled into the second opening 322 to cover the conducting wires 370. Furthermore, the present embodiment forms a number of through holes 382 in the molding compound 380 so as to expose parts of the patterned circuit layer 350. Wherein, the method of forming the through holes 382 includes, for example, forming the through holes 382 during molding the molding compound 380; or using mechanical drill or laser ablation to form the through holes 382 in the molding compound 380 after the molding compound is formed; or using other method to form the through holes 382.

Next, an outer connection terminal 390 is formed in each of the through holes 382 so that these outer connection terminals 390 are electrically connected to the patterned circuit layer 350 through the through holes 382. In a preferred embodiment, the outer connection terminal 390 includes a conducting pole 392 and a solder ball 394. The conducting poles 392 are in the through holes 382 and electrically connected to the patterned circuit layer 350. Wherein, the method of disposing the conducting poles 392 includes, for example, forming the conducting poles 392 into the through holes 382 by plating or directly filling conductive material into the through holes 382 to form the conducting poles 392; or directly disposing the conducting poles 392 at the predetermined location where the through poles 382 are to be formed by molding so that the disposition of the conducting poles 392 is finished while the through holes are formed. The solder balls 394 are disposed on the conducting poles 392 and electrically connected to the conducting poles 392.

Figure 4E:
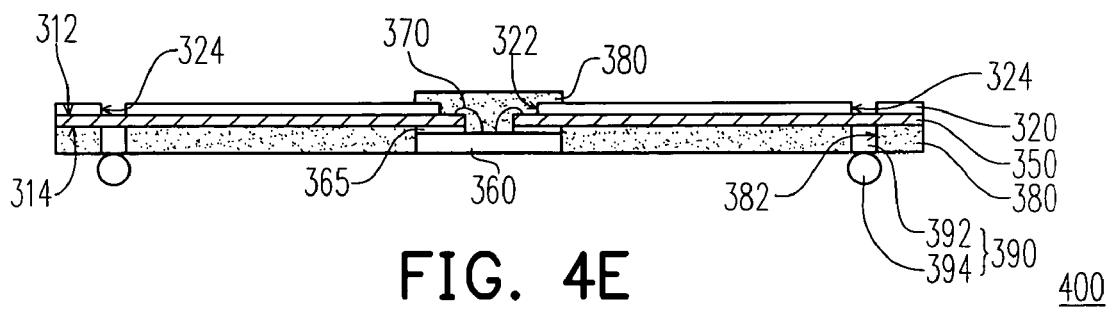

Then, referring to FIG. 4E, the film 330 is removed so as to obtain the chip package 400. Wherein, the method of removing the film 330 can be referred to the illustration of FIG. 2E, hence the details are not repeated. Of course, from the first embodiment and the second embodiment it is known that in this embodiment the electrical connection between the chip 360 and the patterned circuit layer 320 can also be performed by using flip chip technology, chip on flex (COF) technology or other technologies; and the details are omitted.

Therefore, the chip package 400 produced by the present embodiment mainly includes the patterned circuit layer 350, the chip 360, the solder resistance layer 320, the molding compound 380 and a number of outer connection terminals 390. Wherein, the patterned circuit layer 350 has the opposite first surface 312 and second surface 314. The chip 360 is disposed in the second surface 314, and the chip 360 is electrically connected to the patterned circuit layer 350. The solder resistance layer 320 is disposed on the first surface 312 and has a number of first openings 324 to expose parts of the patterned circuit layer 350. The molding compound 380 covers the patterned circuit layer 350 and fixes the chip 360 onto the patterned circuit layer 350. Wherein, the molding compound 380 has a number of through holes 382. The outer connection terminals 390 are respectively disposed in the through holes 382 and electrically connected to the patterned circuit layer 350.

Figure 5:
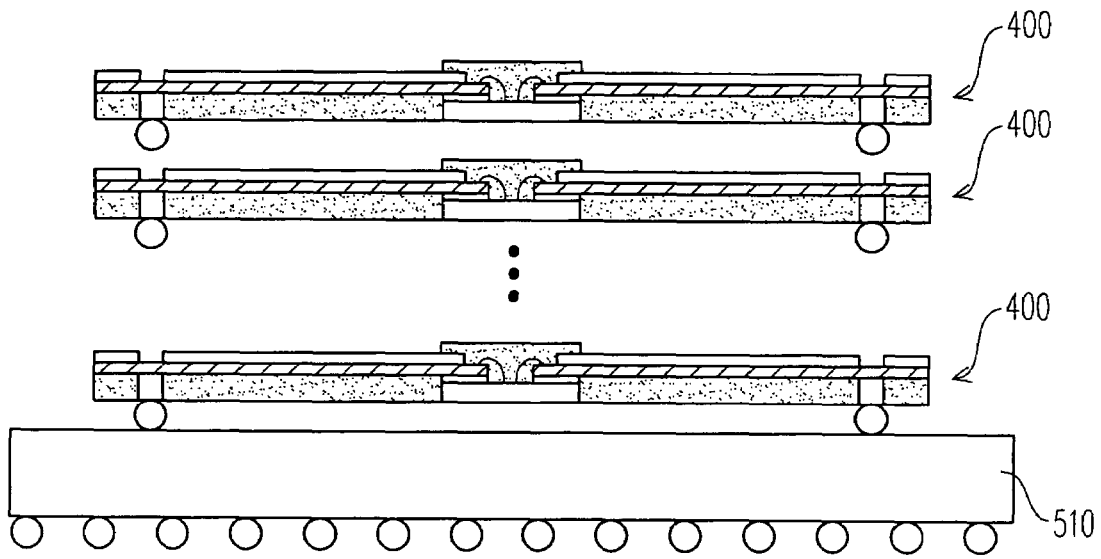
FIG. 5 illustrates the stacked die package of the third preferred embodiment of the present invention.

Based on the abovementioned chip package 400, the present embodiment further provides a stacked die package structure. Refer to FIG. 5, the stacked die package structure in the third embodiment of the present invention is illustrated. The stacked die package 500 mainly includes a number of chip packages 400 stacked one another. Wherein, the outer connection terminals 390 of the upper chip packages 400 are corresponding to the first openings 324 of the lower chip packages 400 and are electrically connected with the patterned circuit layer 350 of the lower chip packages 400. Besides, the stacked die package 500 further includes the common carrier 510 on which these chip packages 400 can be stacked, and that these chip packages 400 can be electrically connected to the common carrier 510 through the outer connection terminals 390 of the lowest chip packages 400.

Because each of the chip packages 400 has a smaller thickness than that produced by the traditional technology, the thickness of the stacked die package 500 stacked by a number of chip packages 400 is reduced significantly.

The Fourth Embodiment

Figure 6A:
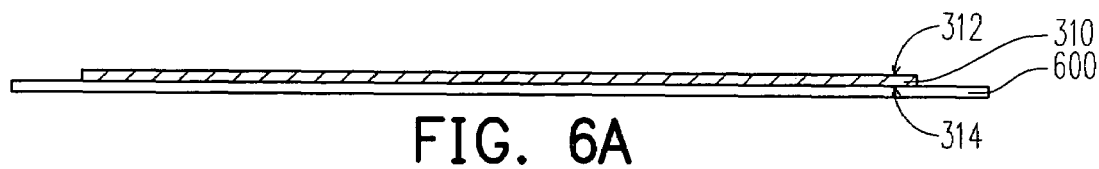
FIG. 6A to FIG. 6D is the flow chart of the manufacturing process for chip package of the fourth preferred embodiment of the present invention.

FIG. 6A to FIG. 6D and FIG. 2B to FIG. 2E are the flow charts of the manufacturing process for chip package of the fourth preferred embodiment of the present invention. This embodiment discloses another manufacturing process for chip package of the present invention. Referring to FIG. 6A, first of all, the conductive layer 310 with the opposite first surface 312 and second surface 314 is provided. Then, the film 600 is formed onto the second surface 314.

Figure 6B:
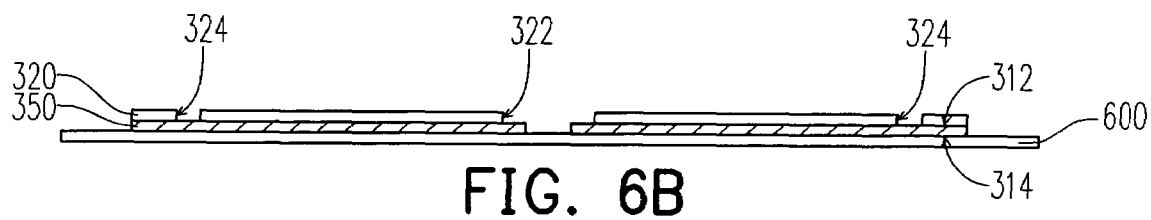

Referring to FIG. 6B, the conductive layer 310 is patterned by, for example, lithography and etching process to form the patterned circuit layer 350. Then, the solder resistance layer 320 is formed onto the first surface 312 and then patterned by, for example, lithography and etching process, so that the third opening 322 and a number of the first openings 324 are formed; wherein, the third opening 322 and the first openings 324 are used to expose parts of the conductive layer 310.

Figure 6C:
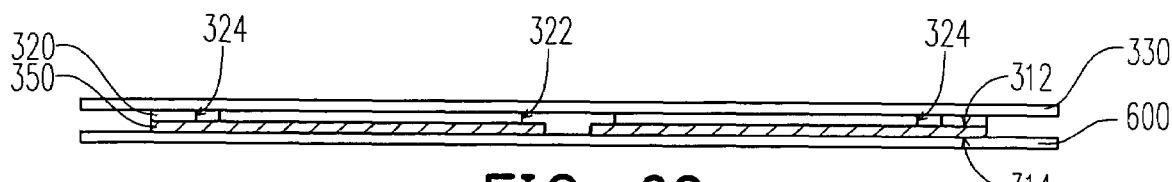
Figure 6D:
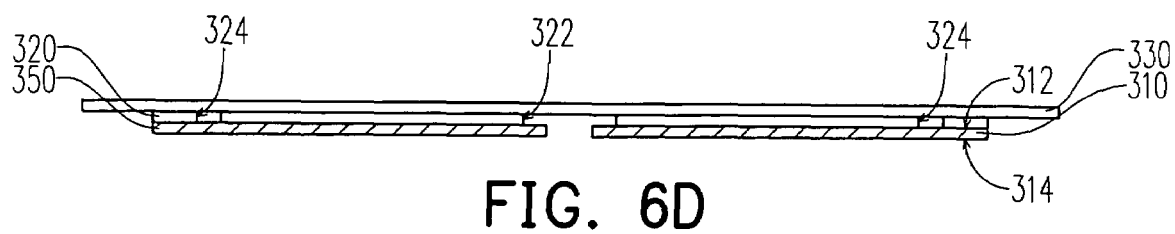

Referring to FIG. 6C and FIG. 6D, first, the film 330 is formed on the solder resistance layer 320 to form the structure as shown in FIG. 6C. Next, as shown in FIG. 6D, the film 600 is removed to get the structure as shown in FIG. 2B. The following steps are the same as illustrated in FIGS. 2B to 2E of the first embodiment; here, the details are omitted. Wherein, the method of removing the film 600 includes, for example, etching, tearing, ashing or other method.

In summary, in the manufacturing process for chip package disclosed by the present invention, film is used as the support of the patterned circuit layer and the solder resistance layer, and the film is removed after the chip package is finished, so that the present invention can produce the chip package without core. Besides, without core, the chip package produced by the present invention has a smaller thickness than the one produced by the traditional technology. In addition, as to the manufacturing process, the present invention omits the core manufacturing process so that the manufacturing process of the present invention is comparatively simple. Thus, the production cost is lowered and the production efficiency is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing process for chip package, comprises:
providing a conductive layer with a first surface and a second surface;
forming a solder resistance layer on the first surface and patterning the solder resistance layer and exposing parts of the conductive layer;
forming a film onto the solder resistance layer;
patterning the conductive layer and forming a patterned circuit layer;
disposing a chip onto the second surface, wherein the chip covers at least parts of the conductive layer, the chip has a plurality of conducting wires, the plurality of conducting wires passes through the patterned circuit layer and contacts to the first surface, and the chip electrically connect to the patterned circuit layer by the plurality of conducting wires;
forming a molding compound to cover the patterned circuit layer and fix the chip onto the patterned circuit layer; and
removing the film.

2. The manufacturing process for chip package as claimed in claim 1, wherein, the film is stuck onto the solder resistance layer through a first adhesive compound.

3. The manufacturing process for chip package as claimed in claim 1 further comprises fixing the film onto a frame so as to perform patterning the conductive layer.

4. The manufacturing process for chip package as claimed in claim 1 further comprises:
forming a number of first openings on the solder resistance layer by patterning the solder resistance layer; and
forming a number of second openings corresponding to the first openings in the film, wherein, these first openings and these second openings are used to expose the conductive layer or parts of the patterned circuit layer.

5. The manufacturing process for chip package as claimed in claim 4 further comprises forming an outer connection terminal in each of the first openings and then electrically connecting these outer connection terminals to the patterned circuit layer through these first openings.

6. The manufacturing process for chip package as claimed in claim 4 further comprises:
forming a number of third openings on the solder resistance layer by patterning the solder resistance layer; and
forming a number of fourth openings corresponding to the third openings in the film, wherein, these third openings and these fourth openings are used to expose parts of the chip and parts of the patterned circuit layer.

7. The manufacturing process for chip package as claimed in claim 6 further comprises:
forming a second adhesive compound between the chip and the patterned circuit layer so as to fix the chip onto the patterned circuit layer; and
connecting the chip electrically to the patterned circuit layer by means of a number of conducting wires.

8. The manufacturing process for chip package as claimed in claim 1 further comprises forming a number of through holes in the molding compound to expose parts of the patterned circuit layer.

9. The manufacturing process for chip package as claimed in claim 8 further comprises forming an outer connection terminal in each of the through holes and electrically connecting these outer connection terminals to the patterned circuit layer through these through holes.

10. The manufacturing process for chip package as claimed in claim 1, wherein, the method of removing the film comprises etching, tearing or ashing.

11. A manufacturing process for chip package, wherein the manufacturing process comprises:
   providing a conductive layer with a first surface and a second surface;
   forming a solder resistance layer on the first surface and patterning the solder resistance layer and exposing parts of the conductive layer;
   forming a film onto the solder resistance layer;
   patterning the conductive layer and forming a patterned circuit layer and an opening;
   forming a number of bumps between a chip and the patterned circuit layer;
   disposing the chip onto the second surface and electrically connecting the chip to the patterned circuit layer through the bumps, wherein the chip covers at least parts of the conductive layer, and the opening of the conductive layer directly exposes a portion of the chip;
   forming a molding compound to cover the patterned circuit layer and fix the chip onto the patterned circuit layer; and removing the film.

12. The manufacturing process for chip package as claimed in claim 11 further comprises forming an under fill between the chip and the patterned circuit layer so as to cover the bumps.

13. A manufacturing process for chip package comprises:
   providing a conductive layer with a first surface and a second surface;
   forming a first film onto the first surface;
   patterning the conductive layer and forming a patterned circuit layer;
   forming a solder resistance layer on the patterned circuit layer and patterning the solder resistance layer and exposing parts of the patterned circuit layer;
   forming a second film on the solder resistance layer and removing the first film;
   disposing a chip on the first surface, wherein the chip covers at least parts of the conductive layer, the chip has a plurality of conducting wires, the plurality of conducting wires passes through the patterned circuit layer and contacts to the second surface, and the chip electrically connects to the patterned circuit layer by the plurality of conducting wires;
   forming a molding compound to cover the patterned circuit layer and fix the chip onto the patterned circuit layer; and removing the second film.

14. The manufacturing process for chip package as claimed in claim 13, wherein, the first film and the second film are stuck respectively to the first surface and the solder resistance layer by means of a first adhesive compound.

15. The manufacturing process for chip package as claimed in claim 13 further comprises fixing the second film onto a frame.

16. The manufacturing process for chip package as claimed in claim 13 further comprises:
   forming a number of first openings on the solder resistance layer by patterning the solder resistance layer; and
   forming a number of second openings corresponding to the first openings in the second film, wherein, these first openings and second openings are used to expose parts of the patterned conductive layer.

17. The manufacturing process for chip package as claimed in claim 16 further comprises forming an outer connection terminal in each of the first openings, and electrically connecting these outer connection terminals to the patterned circuit layer through the first openings.

18. The manufacturing process for chip package as claimed in claim 13 further comprises forming a number of through holes in the molding compound so as to expose parts of the patterned circuit layer.

19. The manufacturing process for chip package as claimed in claim 18 further comprises forming an outer connection terminal in each of the through holes and electrically connecting these outer connection terminals to the patterned circuit layer through the through holes.

20. The manufacturing process for chip package as claimed in claim 13 further comprises:
   forming a number of third openings on the solder resistance layer by patterning the solder resistance layer; and
   forming a number of fourth openings corresponding to the third openings on the second film, wherein, these third openings and these fourth openings are used to expose parts of the chip and parts of the patterned circuit layer.

21. The manufacturing process for chip package as claimed in claim 20 further comprises:
   forming a second adhesive compound between the chip and the patterned circuit layer so as to fix the chip onto the patterned circuit layer; and
   connecting the chip electrically to the patterned circuit layer by means of a number of conducting wires.

22. The manufacturing process for chip package as claimed in claim 13, wherein, the method of removing the film comprises etching, tearing or ashing.

23. A manufacturing process for chip package comprises:
   providing a conductive layer with a first surface and a second surface;
   forming a first film onto the first surface;
   patterning the conductive layer and forming a patterned circuit layer and an opening;
   forming a solder resistance layer on the patterned circuit layer and patterning the solder resistance layer and exposing parts of the patterned circuit layer;
   forming a second film on the solder resistance layer and removing the first film;
   forming a number of bumps between a chip and the patterned circuit layer;
   disposing the chip on the first surface and electrically connecting the chip to the patterned circuit layer through the bumps, wherein the chip covers at least parts of the conductive layer, and the opening of the conductive layer directly exposes a portion of the chip;
   forming a molding compound to cover the patterned circuit layer and fix the chip onto the patterned circuit layer; and removing the second film.

24. The manufacturing process for chip package as claimed in claim 23 further comprises forming an under fill between the chip and the patterned circuit layer to cover the bumps.

* * * * *